United States Patent
Confalonieri et al.

(10) Patent No.: US 7,212,143 B1
(45) Date of Patent: May 1, 2007

(54) CIRCUIT FOR SELECTIVELY ANALOG SIGNALS INTO DIGITAL CODES

(75) Inventors: Pierangelo Confalonieri, Caponago (IT); Marco Zamprogno, Cesano Maderno (IT); Francesca Girardi, Milan (IT); Angelo Nagari, Cilavegna (IT)

(73) Assignee: STMicroelectronics S.R.L., Agrate Brianza, (Milan) (IT)

( * ) Notice: Subject to any disclaimer, the term of this patent is extended or adjusted under 35 U.S.C. 154(b) by 0 days.

(21) Appl. No.: 11/336,657

(22) Filed: Jan. 20, 2006

(51) Int. Cl.
*H03M 1/12* (2006.01)
(52) U.S. Cl. ............... 341/155; 341/141; 341/161; 341/162; 341/163
(58) Field of Classification Search ............... 341/141, 341/155, 161
See application file for complete search history.

(56) References Cited

U.S. PATENT DOCUMENTS

| | | | | |
|---|---|---|---|---|
| 4,654,632 A * | 3/1987 | Yoshida et al. | ............. | 341/141 |
| 5,172,116 A * | 12/1992 | Noma | ............. | 341/141 |
| 5,331,324 A * | 7/1994 | Nakajima | ............. | 341/141 |
| 5,619,201 A * | 4/1997 | Imakura | ............. | 341/141 |
| 6,147,635 A * | 11/2000 | Barrenscheen et al. | ..... | 341/155 |
| 6,433,716 B2 * | 8/2002 | Arai et al. | ............. | 341/141 |
| 6,507,298 B1 * | 1/2003 | Barrenscheen et al. | ..... | 341/141 |
| 6,653,963 B1 * | 11/2003 | Barrenscheen et al. | ..... | 341/155 |
| 6,795,010 B1 * | 9/2004 | Potlapalli et al. | ............. | 341/155 |
| 7,106,237 B1 * | 9/2006 | Confalonieri et al. | ....... | 341/155 |
| 7,126,515 B1 * | 10/2006 | Kris | ............. | 341/141 |
| 2005/0040978 A1 * | 2/2005 | Morita et al. | ............. | 341/141 |

FOREIGN PATENT DOCUMENTS

| EP | 1 566 888 A1 | 8/2005 |
|---|---|---|
| EP | 1 583 242 A1 | 10/2005 |

* cited by examiner

*Primary Examiner*—Khai M. Nguyen
(74) *Attorney, Agent, or Firm*—Hogan & Hartson LLP (57) ABSTRACT

A circuit for selectively converting at least one analog signal into corresponding digital codes. The circuit includes a management block having a plurality of inputs, each adapted for receiving a respective request signal carrying a request to convert the at least one analog signal. The management block is adapted to assign a priority level to the request signals based upon the input where the request signals are received, and is further operative to select one of the request signals based upon the assigned priority level and output a conversion start-up signal corresponding to the selected request signal. The circuit has a conversion block for receiving east one analog signal input and is connected to the management block to receive the conversion start-up signal as input, and start up conversion of the at least one analog signal.

17 Claims, 7 Drawing Sheets

CIRCUIT FOR SELECTIVELY ANALOG SIGNALS INTO DIGITAL CODES

FIELD OF THE INVENTION

The present invention relates to the processing of analog signals for conversion into digital signals. More particularly, the present invention relates to a circuit for converting analog signals into digital codes.

BACKGROUND OF THE INVENTION

Many electronic devices which use integrated circuits for the processing of analog and digital signals have to convert analog signals provided from independent units into digital signals or have to convert the same analog signal into a digital signal to satisfy requests from several independent units.

In these cases, since the requests for conversion can be almost simultaneous, i.e., concurrent, the prior art provides for the use of a plurality of analog/digital converters.

Figure 1:
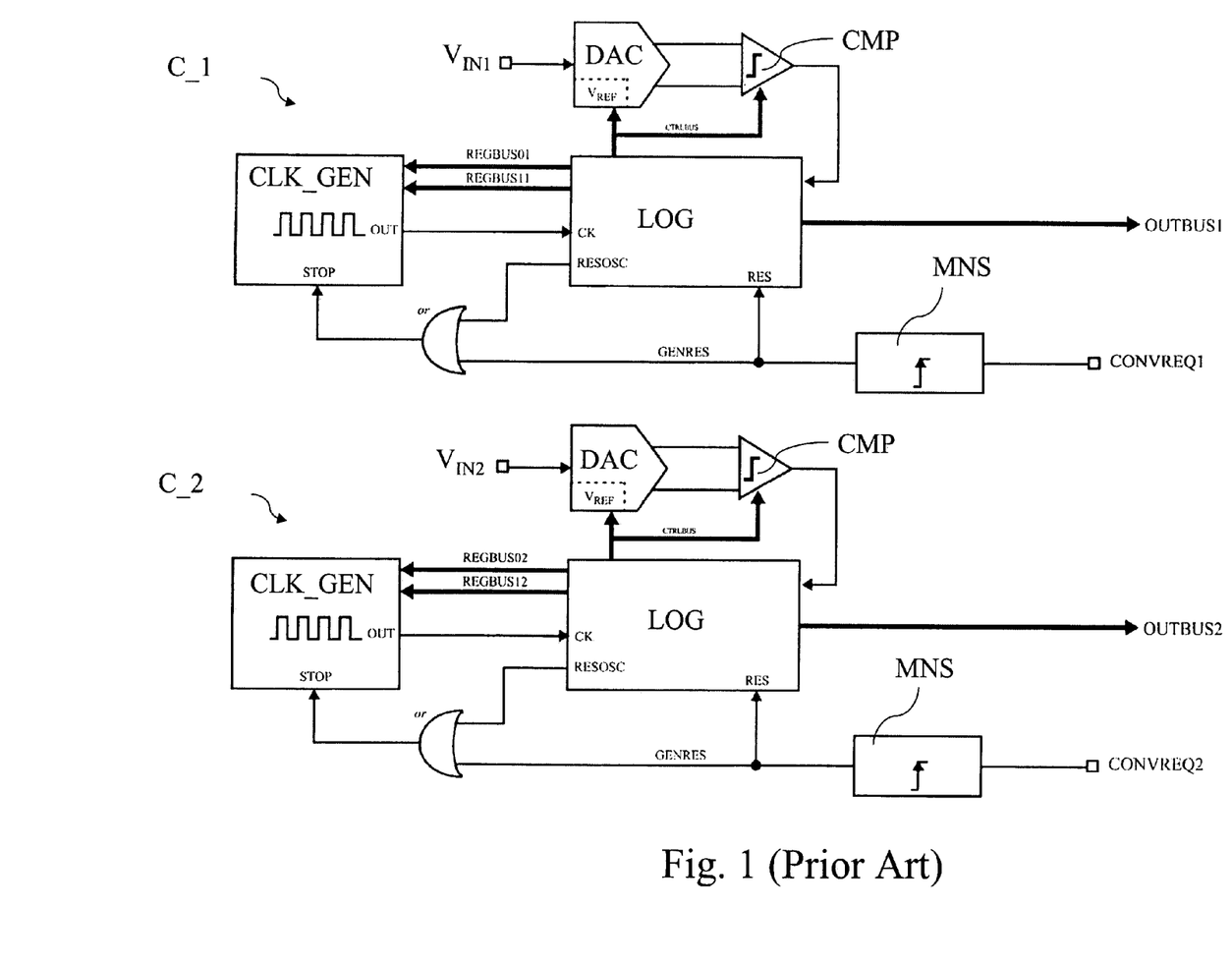
FIG. 1 schematically shows a conversion structure according to the prior art and including two distinct analog/digital converters.

For example, in the conversion structure schematically illustrated in FIG. 1, two distinct analog/digital converters C_1, C_2 are used, each of which is provided for converting a respective analog signal $V_{IN1}$, $V_{IN2}$ into a digital signal. Request to convert the analog signal $V_{IN1}$ is, for example, sent to converter C_1 from a first unit (not shown) by means of a conversion request signal CONVREQ1. After completion of the conversion, converter C_1 makes available, i.e. writes, a digital code resulting from the digital conversion of the analog signal $V_{IN1}$ on an assigned bus OUTBUS1. Similarly, the request to convert the analog signal $V_{IN2}$ is sent to converter C_2 from a second unit (not shown) and independent from the first unit, by means of a conversion request signal CONVREQ2. At the end of this conversion, circuit C_2 makes available, on an assigned bus OUTBUS2, a digital code resulting from the digital conversion of the analog signal $V_{IN2}$.

In the structure illustrated in FIG. 1, a situation without a system clock is shown, so that the two converters C_1, C_2 use a clock signal generated locally by a respective oscillator CLK_GEN included in each of them. A detailed description of the functioning of such converters C_1 and C_2 is, for example, given in the European patent application EP 1583242.

As is known, analog/digital converters absorb energy even when they are not used to carry out their functions and occupy relatively large areas of the integrated circuit. For this reason, a conversion system of the type illustrated in FIG. 1 is unfavorable. Furthermore, the use of this architecture becomes impractical if there is a considerable number of analog signals to be converted and/or number of requesting units. This happens, for example, with mobile phones where size requirements are crucial and numerous analog signals normally have to be converted for a plurality of requesting units.

SUMMARY OF THE INVENTION

An object of the present invention is to provide a circuit to convert at least one analog signal into digital codes. The circuit can manage conversion requests generated by units independent from each other and consumes less energy and occupies less space than the prior art.

A circuit of the present invention for selectively converting at least one analog signal into corresponding digital codes includes a management block having a plurality of inputs, each receiving a respective request signal requesting conversion of the at least one analog signal. The management block includes means for assigning a corresponding priority level to the request signals based upon the input where the request signals are received. The management block is also operative to select one of the request signals based upon the assigned priority level and output a conversion start-up signal corresponding to the selected request signal. The circuit includes a conversion block for receiving as input the at least one analog signal. It is connected to the management block so as to receive as input the conversion start-up signal and start up conversion of the at least one analog signal.

BRIEF DESCRIPTION OF THE DRAWINGS

Further features and advantages of the present invention will become more apparent from the following detailed description of an exemplary but non-limiting embodiment thereof, as illustrated in the accompanying drawings, in which.

In the figures, equal or similar elements will be indicated with the same reference.

DETAILED DESCRIPTION

This description will refer to a conversion circuit which is provided to selectively convert at least one analog signal into corresponding digital codes including an analog/digital converter of the same type as the converter C_1 or C_2 in FIG. 1 which, including an internal oscillator CLK_GEN, can also function without an external clock signal. A converter of this type is, for example, described in the European Patent Application No. EP 1583242, which is incorporated herein by reference in its entirety. However, it should be considered that a conversion circuit according to the present invention can also be produced by using a different type of analog/digital converter.

In order to make this description clearer, a description of the structure and functioning of one of the converters C_1, C_2 illustrated in FIG. 1, e.g., the converter C_1, is now summarized.

The converter C_1 is a SAR (Successive Approximation Register) analog/digital converter which, for the quantization of an analog input signal to be converted, uses a DAC analog/digital converter (which includes a reference voltage source VREF) and a comparator CMP. It also includes a logic unit LOG (which includes a register) with timing and control functions connected to the converter DAC and to the comparator CMP by a control bus CTRLBUS. A timing pulse signal, or clock signal coming from a clock pulse generator, indicated with CLK_GEN, is applied to a terminal CK of the logic unit LOG. An input voltage to be converted $V_{IN1}$ is applied to the converter DAC and a conversion request signal CONVREQ1 is applied to a start and reset terminal RES of the logic unit LOG. A sequence of timed signals from the clock activates the converter DAC and the comparator CMP and enables loading of the sample $V_{IN1}$ to be converted. The register of the unit LOG is set to a digital value corresponding to the center of the conversion scale range (10000000 in the case of an 8 bit register). Therefore, the converter DAC supplies an output voltage VDAC=VREF/2. The comparator CMP compares said voltage to the voltage $V_{IN1}$ and sends the result of the comparison to the logic unit. If $V_{IN1}$>VDAC, the comparator output is a logic "1" and the most significant bit of the register remains at "1". If however $V_{IN1}$<VDAC, the comparator output is a logic "0" and the most significant bit of the register is switched to a logic "0". Then the successive bit of the register is set at "1" and another comparison is carried out with the same criterion and then another until the least significant bit is examined. At this point conversion is finished and the register contains the digital code, in this example of 8 bits, corresponding to the input voltage $V_{IN1}$. Said code is available on the output OUTBUS1 of the logic unit LOG and of the register which is the converter output.

The converter C_1 further comprises a generator of single pulses, in this embodiment an analog monostable circuit MNS, and a logic gate OR. The logic unit LOG also has an output, indicated with RESOSI, for a generator stop signal CLK_GEN and two output buses REGBUS01 and REGBUS11 for adjustment of the operating parameters of the generator itself.

The generator CLK-GEN has an output terminal OUT connected to the clock terminal CK of the logic unit LOG, an input activation terminal STOP connected to the output of the gate OR and two inputs connected to the logic unit by means of the two buses REGBUS01 and REGBUS11. The monostable MNS has an input terminal where the conversion request signal CONVREQ1 is applied and an output terminal GENRES connected to the reset and start input terminal RES of the logic unit and to an input terminal of the gate OR. The latter has a second input terminal connected to the output terminal RESOSC of the logic unit.

The generator CLK-GEN is an pulse generator which is activated when a binary signal applied to its STOP input is in a predetermined state of the two logic states and produces, on its output terminal OUT, an oscillation which can be used immediately since it is not affected by transitory phenomena. Furthermore, when the input signal STOP switches to the other of the two logic states, it stops in a known condition, i.e. all its nodes always lead to the same predetermined binary values; therefore, when it is re-started (STOP=0), it starts up with correct oscillation from the first half-period. A generator of this type is described in European patent application no. 04425100.7, which is incorporated herein in its entirety by reference.

Figure 2:
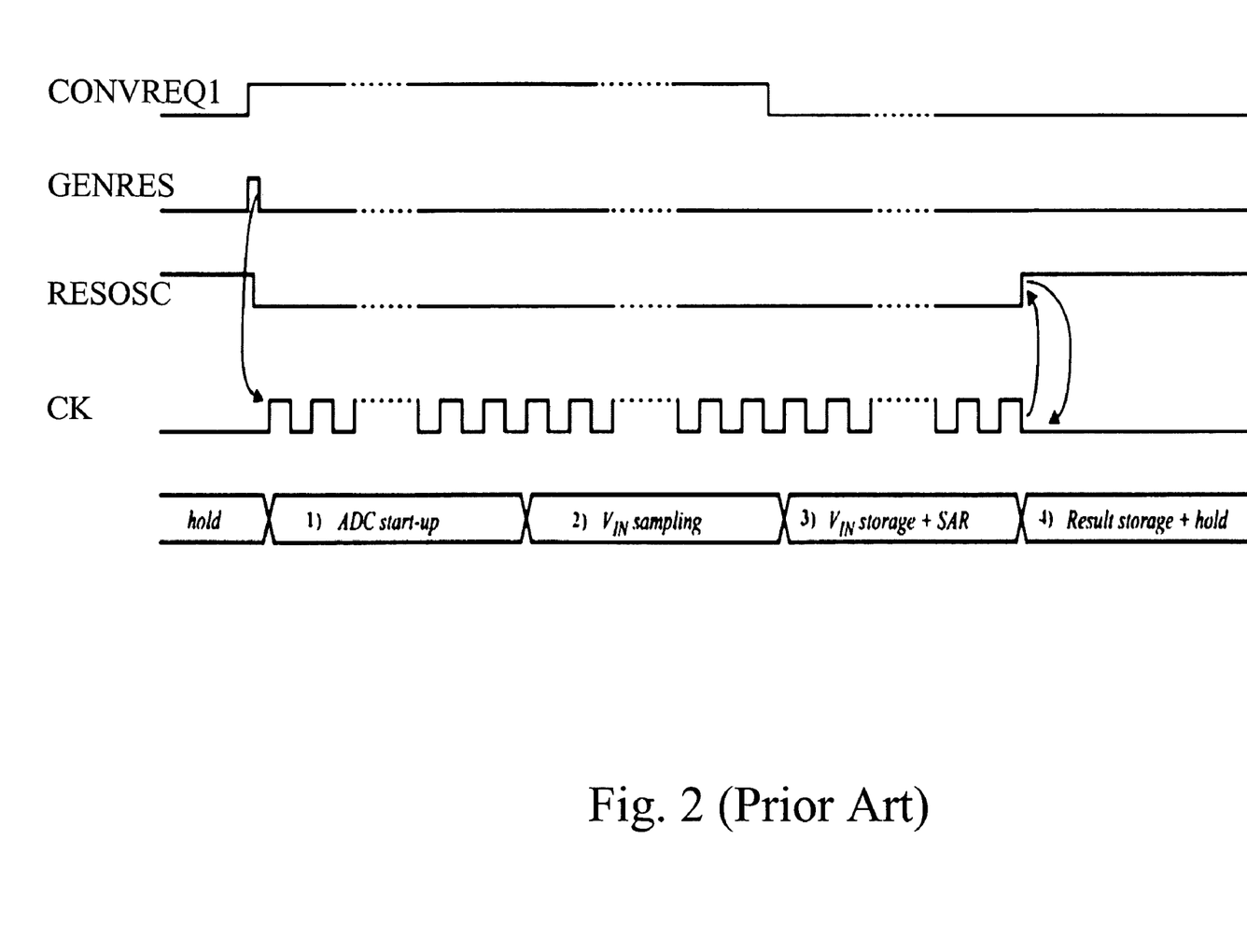
FIG. 2 shows some waveforms relative to the functioning of one of the converters in FIG. 1.

Now the operation of the converter C_1 will be considered with reference to the waveforms illustrated in FIG. 2.

The monostable MNS generates a single pulse GENRES of a predetermined duration following a conversion request. In this example the pulse GENRES is produced when the signal CONVREQ1 applied to the monostable input switches from 0 to 1 and has a duration sufficient to set the logic unit LOG in its initial condition. In practice, the signal GENRES resets a counter contained in the logic unit to 0, sets the output RESOSC to 0 (for example by means of a flip-flop, controlled by the signal GENRES, which maintains the set state even after the end of the signal GENRES) and prevents activation of the oscillator for its entire duration. In fact, it should be noted that the generator does not oscillate until STOP=1, i.e., both with RESOSC=1 and with GENRES=1, while it oscillates when STOP=0, i.e., only when the two inputs of the gate OR (RESOSC and GENRES) are both at 0. In this way, start-up of the oscillator is delayed for a period of time equal to the duration of the pulse GENRES. Once the monostable pulse has ended (GENRES=0), the generator produces a clock signal CK with a frequency and duty-cycle determined by the digital values applied to the buses REGBUS01 and REGBUS11, until RESOSC returns to 1 and causes the oscillator to stop (STOP=1). During generator activity, the clock signals cause the counter in the logic unit LOG to increase, giving rise to successive emission of the signals necessary for the quantization elements (DAC, CMP) to carry out the operations, timed by the timing pulses, in order to convert the input analog sample $V_{IN1}$ into a digital code.

Starting from an initial holding condition for all circuits, during which the device consumes only the energy absorbed by current dispersion, conversion takes place according to the following steps:

ADCstart-up: start-up of the analog parts of the converter (DAC, voltage source, comparator CMP, polarization circuits if any), VINsampling: the voltage signal $V_{IN1}$ to be converted is fed into an array of capacitors of the converter DAC, VINstorage+SAR: the voltage $V_{IN1}$ is stored and the procedure SAR is started to determine the digital code corresponding to $V_{IN1}$, Resultstorage+hold: the result is sent to the output bus OUTBUS1, the pulse generator is stopped and the analog parts are put on hold following a special command signal from the logic unit.

At the beginning of step 4) the last falling edge of the clock ensures that the counter of the logic unit LOG causes the signal RESOSC to switch to 1 (and the digital code resulting from the conversion to transfer to the OUTBUS and the circuits to go on hold). In this way, the generator has STOP=1 on the start-up input, in such a way that the output OUT is at 0 and the clock stops after the pulse which determined RESOSC=1: consequently, all activity of the logic unit LOG is stopped due to the absence of the clock. This state is maintained until a new rising edge of the conversion request signal CONVREQ1. The number of clock pulses for each step depends on the circuit characteristics and parameters.

In the embodiment described with reference to FIGS. 1 and 2, a clock signal with 50% duty-cycle was considered, but it is evident that this duty-cycle value can be changed as desired, even while the generator is functioning, by suitably changing the digital codes which the logic unit sends to the clock pulse generator on the buses REGBUS01 and REGBUS11.

Figure 3:
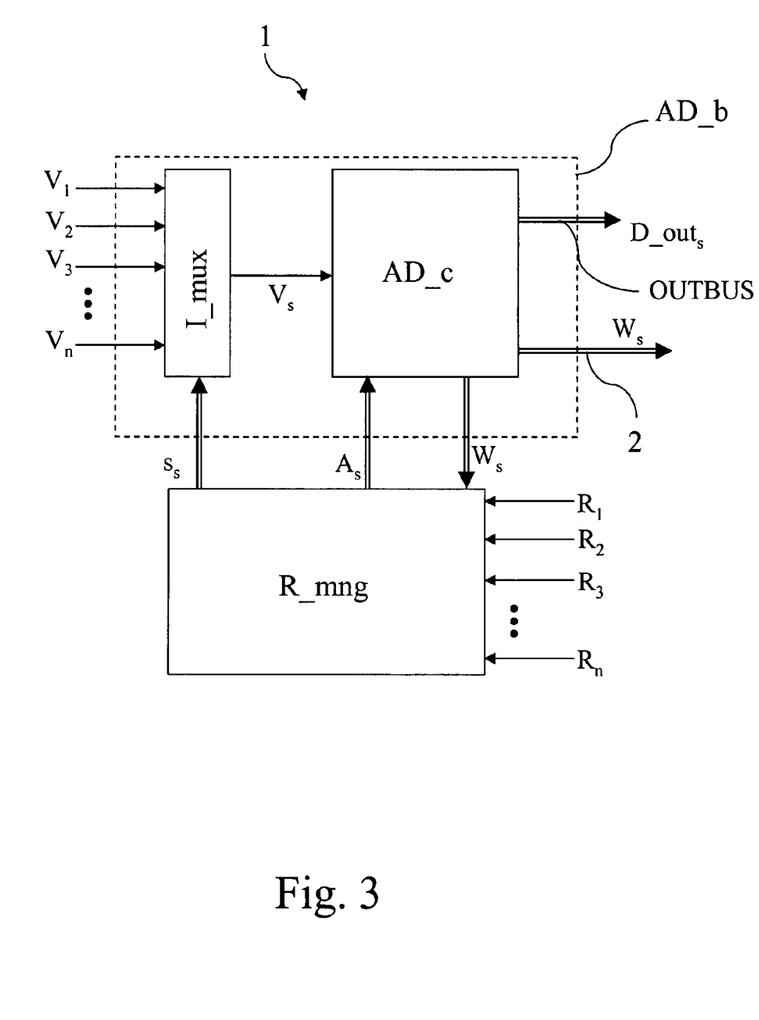
FIG. 3 shows a simplified block diagram of a conversion circuit according to the present invention.

FIG. 3 illustrates a general diagram of a circuit, according to the present invention, for selectively converting at least one analog signal into digital codes.

In this particular embodiment, the conversion circuit, generally indicated with 1, is provided for selectively converting a plurality of input analog signals $V_1, \ldots, V_n$ into corresponding output digital codes D_Outs.

The conversion circuit 1 comprises a management block R_mng comprising a plurality of inputs, each provided for receiving a respective request signal $R_1, \ldots, R_n$ carrying a conversion request from one of the analog signals $V_1, \ldots, V_n$ in input to the conversion circuit 1. For example, the request signal $R_1$ is sent from a first remote unit, not illustrated in the figure, to request the conversion circuit 1 to digitally convert the signal $V_1$, the request signal $R_2$ is sent from a second remote unit, not illustrated in the figure, to request the conversion circuit 1 to digitally convert the signal $V_2$ and so on. The different request signals $R_1, \ldots, R_n$ can be asynchronous and concurrent with each other.

Advantageously, the management block R_mng is provided for assigning, to the received request signals $R_1, \ldots, R_n$, a corresponding priority level based on the input of the management block R_mng where said request signals are received. Furthermore, the management block R_mng is provided for selecting one $R_S$ of said request signals on the basis of the priority levels assigned to them and for providing an output conversion start-up signal $A_S$ corresponding to the selected request signal $R_S$ and produced starting from said request signals.

In a particularly preferred embodiment, the management block R_mng includes a network of logic gates and delaying elements which make it possible to assign priority levels to the request signals and to select one of these signals.

The conversion circuit 1 further comprises a conversion block AD_b suitable to receive the analog input signals $V_1, \ldots, V_n$ to be converted. The conversion block AD_b is connected to the management block R_mng to receive the conversion start-up signal $A_S$ and to start conversion of the analog signal $V_S$ corresponding to the selected request signal $R_S$. In this embodiment, but not limited to it, each request signal can request conversion of a respective analog signal. Evidently, other variants can be considered wherein several requesting units request conversion of the same analog signal. In an extreme case, all the requesting units can request conversion into digital codes of a single analog input signal of the conversion block AD_b.

Advantageously, the conversion block AD_b further includes an output connected to another input of the management block R_mng in order to send it a signal $W_S$ indicating completion of conversion of the signal $V_S$. As shown in FIG. 3, in a particularly preferred embodiment, the conversion completion signal $W_s$ is also preferably sent, by means of a special output 2, to the unit which sent the conversion completion request to the circuit 1. Once conversion has been completed, the conversion block AD_b is provided to make available on an output bus the digital signal $D\_out_S$, which in practice represents a sample of the input analog signal $V_S$ converted into a digital code. In a preferred embodiment, the conversion block AD_b is adapted to provide the digital signal $D\_out_S$ on a particular output bus selected among a plurality of distinct output buses each of which can connect the conversion circuit 1 to a respective requesting unit.

As illustrated in FIG. 3, in a particularly preferred embodiment, in the particular case described above wherein each requesting unit requests conversion of a respective analog signal, the conversion block AD_b includes:

an analog/digital converter AD_c with an input to selectively receive one of the analog input signals $V_1, \ldots, V_n$ to be converted; and input selection mechanism or device I_mux including a plurality of inputs to receive the plurality of analog signals $V_1, \ldots, V_n$ to be converted and to select among these an analog signal $V_s$ to be input into the converter AD_c.

Preferably, the selection mechanism I_mux is also provided to receive from the management block R_mng a selection signal $S_S$ to select the analog input signal corresponding to the selected request signal $R_S$, and further including an output connected to the input of the converter AD_c to send to said converter the analog signal $V_S$ to be converted corresponding to the selected request signal $R_S$.

In a particularly advantageous embodiment, the management block R_mng operates in such a way as to:

hold a first received conversion request with an assigned first priority level until conversion, started by a second concurrent request signal with an assigned second priority level, has been completed, if the second priority level is greater than or equal to the first level, otherwise abort the conversion started by the second request signal, holding the second request signal if the second level is lower than the first level; in this case, the second request signal will be held until conversion started by the first request signal has been completed.

Figure 4:
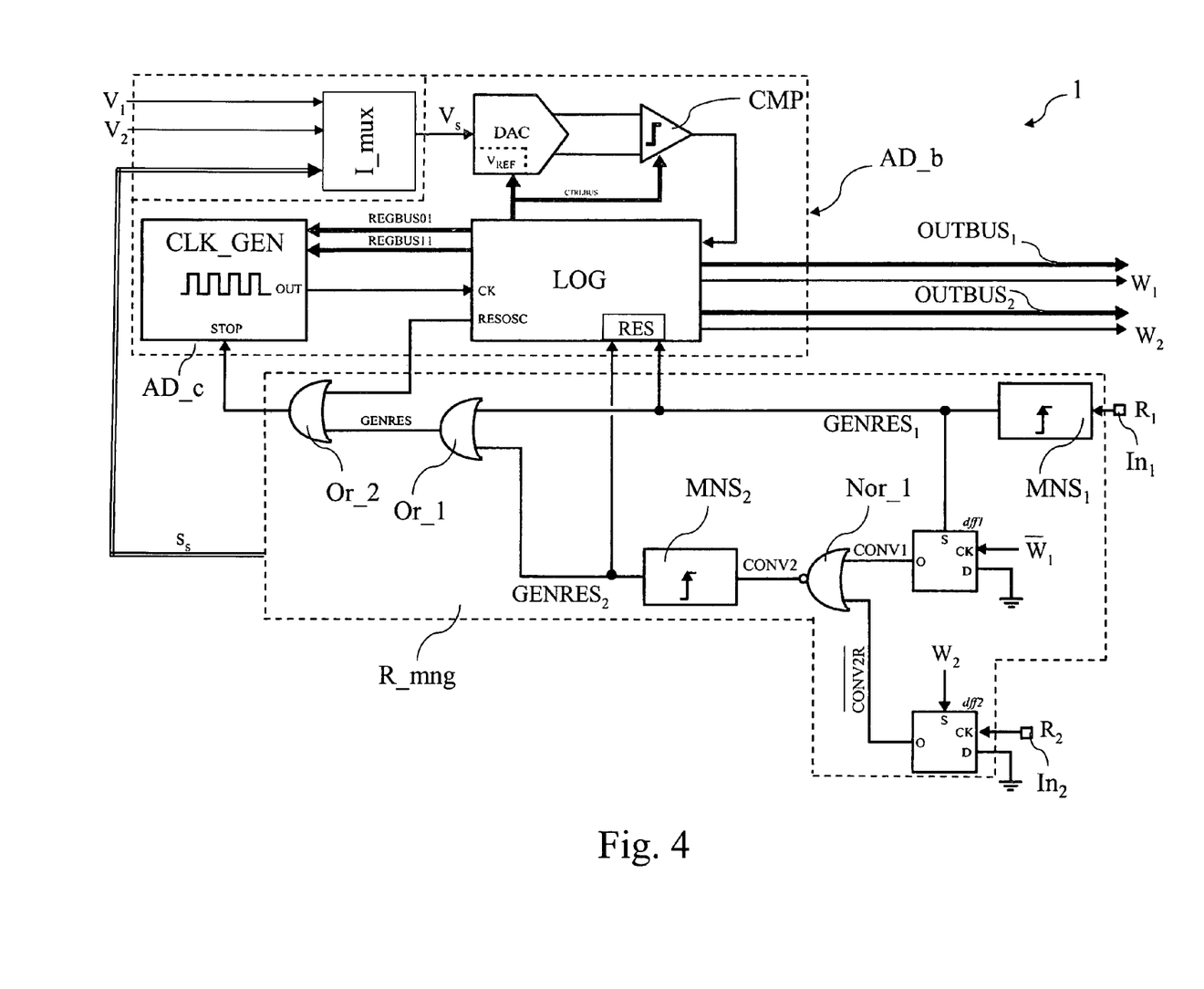
FIG. 4 shows a first embodiment of a conversion circuit according to the present invention.

FIG. 4 shows a block diagram of a first embodiment of a conversion circuit 1 according to the present invention. In the particular embodiment in FIG. 4 the circuit 1 is provided to selectively convert a first analog signal $V_1$ or a second analog signal $V_2$ into corresponding digital codes.

The management block R_mng is implemented by means of a network of logic gates Or_1, Or_2, Nor_1, delaying elements dff1, dff2 and monostable circuits $MNS_1$, $MNS_2$ and comprises a first $In_1$ and a second input $In_2$ to receive respectively a first $R_1$ and a second $R_2$ conversion request signal sent to the conversion circuit 1 from a first and a second requesting unit not illustrated in the figure. In practice, by means of the signal $R_1$, the first unit requests the conversion circuit 1 to convert the corresponding analog input signal $V_1$ and, by means of the signal $R_2$, the second unit requests the conversion circuit 2 to convert the corresponding analog signal $V_2$.

The management block R_mng is provided to assign to the input request signals $R_1$, $R_2$ different priority levels on the basis of the input where these are received. In the particular embodiment illustrated, the management block R_mng is provided to assign to the request signal $R_1$ a higher priority level than the signal $R_2$, so that a conversion request from the first requesting unit is immediately processed while a conversion request from the second requesting unit is subordinated to the conversion request from the first unit.

In the embodiment in FIG. 4, the conversion block AD_b includes a SAR type analog/digital converter AD_c very similar in structure and operation, but with a few differences, to the converter C_1 already described with reference to FIG. 1 and in the above-mentioned European patent application EP 1583242 incorporated herein in its entirety herein by reference. A first difference regards the fact that in the circuit in FIG. 4 the converter AD_c is connected to two output buses $OUTBUS_1$ and $OUTBUS_2$, to send the result of a completed conversion to the first or to the second requesting unit respectively. Similarly, a further two outputs are provided on the converter AD_c to make available two respective conversion completion signals $W_1$ and $W_2$. Said signals $W_1$ and $W_2$ are, for example, intended for the requesting units so as to inform said units that the conversion requested by them has been completed and that the converted signal is present on the assigned bus, i.e., on either $OUTBUS_1$ or $OUTBUS_2$ depending on the requesting unit.

In an alternative embodiment not illustrated in the figure, only one output bus is provided which is shared by the different requesting units and which can be selectively accessed by them following reception of the conversion completion signal $W_1$ or $W_2$.

The conversion completion signals $W_1$ and $W_2$ are also preferably sent to the management circuit R_mng.

Another difference to the converter C_1 in FIG. 1 is given by the fact that, in the circuit in FIG. 4, the logic unit LOG includes two distinct reset inputs RES which make it possible for said unit to be selectively reset by a first start-up and reset signal $GENRES_1$ and by a second start-up and reset signal $GENRES_2$. As will be explained hereunder, said signals are provided to start up conversion by the converter AD_c of the input signal $V_s$ (i.e., in this embodiment $V_1$ or $V_2$) corresponding to the selected request signal $R_s$ (i.e., in this embodiment $R_1$ or $R_2$), therefore corresponding selectively to the conversion start-up signal indicated with $A_s$ in the general diagram in FIG. 3. The presence of two distinct reset inputs RES represents a possible expedient to make it possible for the logic unit LOG to identify the requesting unit which started up the conversion, in such a way that the digital signal resulting from said conversion can be sent to the assigned output bus (if several output buses are provided) or so that the requesting unit which requested the conversion can be informed, by means of the signal $W_1$ or $W_2$, that conversion has been completed.

Figure 5:
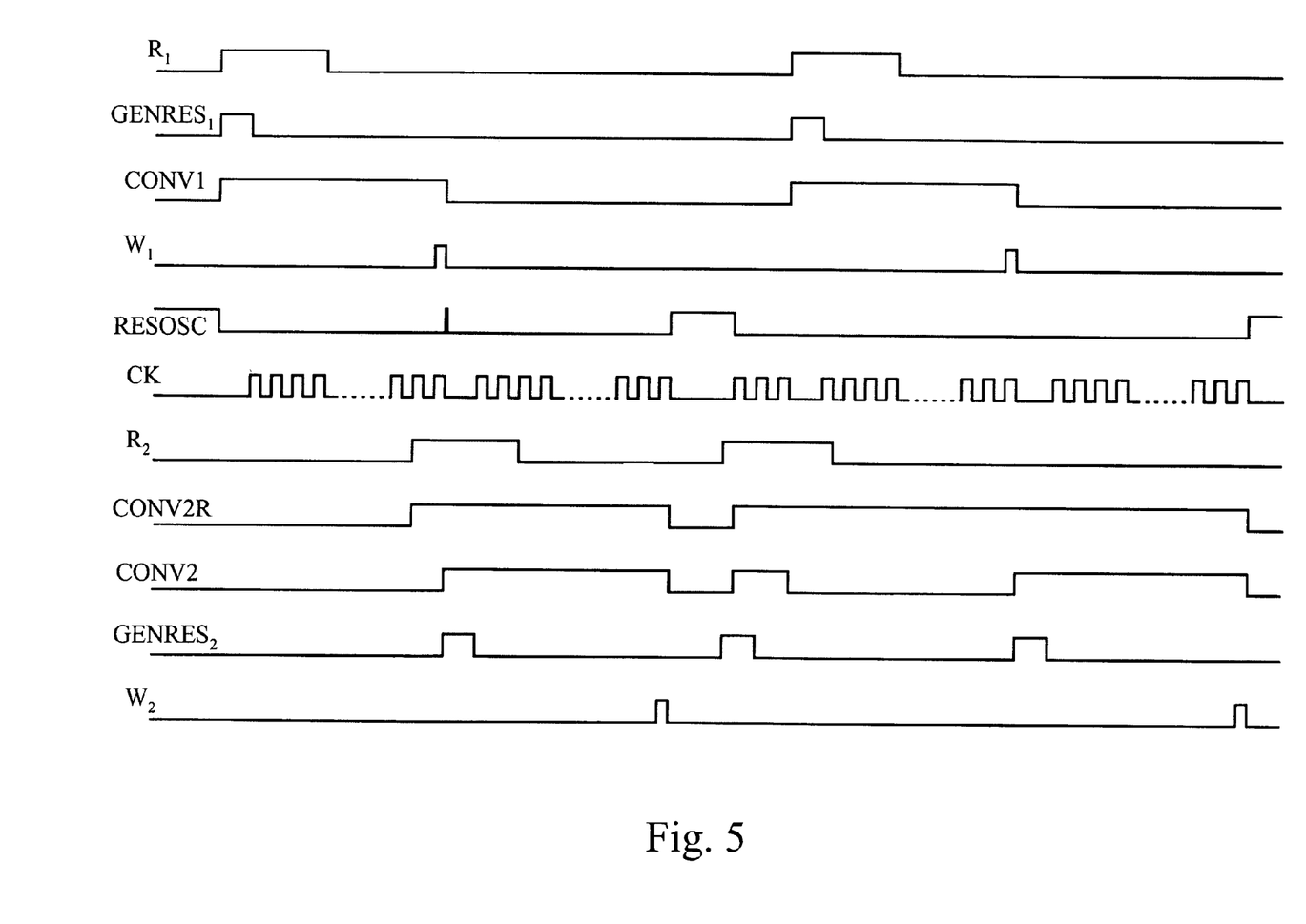
FIG. 5 shows some waveforms which illustrate the functioning of the conversion circuit in FIG. 4.

With reference to the waveforms illustrated in FIG. 5, the functioning of the conversion circuit 1 in FIG. 4 will be briefly explained hereunder.

When the first requesting unit sends a conversion request to the circuit 1, the conversion request signal $R_1$ switches from logic level 0 to logic level 1 and maintains said level for a predetermined length of time. As a result of said transition, the analog monostable $MNS_1$ produces an output signal $GENRES_1$, with a single pulse, which produces the signal GENRES and resets the logic unit LOG, so starting up conversion of the input signal $V_1$. According to the description above with reference to FIG. 1, said conversion starts when RESOSC and GENRES both have value 0. The input selection means I_Mux, which include for example an analog multiplexer, send the analog input signal $V_1$ to the converter AD_c, said means being controlled by a selection signal $S_s$ in output from the management block R_mng and for example obtained from the signals $GENRES_1$ and $GENRES_2$ in a way known to the skilled in the art.

Moreover, the signal $GENRES_1$ sets a delay-flip-flop dff1 forcing the output CONV1 to switch to 1. The meaning of said logic value of the signal CONV1 is that conversion is underway. CONV1 will maintain said logic value for the entire duration of conversion. By means of gate Nor_1, starting from the CONV1 signal, a signal CONV2 is produced which remains at a low logic level for the entire duration of conversion of the signal $V_1$ independently of the logic value of the request signal $R_2$.

If, during conversion of the signal $V_1$, a conversion request $R_2$ to convert the input signal $V_2$ arrives (in the example, the signal $R_2$ switching from logic level 0 to logic level 1), said request is stored by means of the delay-flip-flop dff2 where an output signal CONV2R negated is produced having a logic level 0, indicating the presence of a non-priority conversion request in queue. Said request cannot be processed as long as CONV1 is equal to 1. Once conversion of the signal $V_1$ has been completed, the corresponding digital signal is written on the bus $OUTBUS_1$ and the falling edge of the signal $W_1$, by means of the flip-flop dff1, takes the signal CONV1 to 0. In this way CONV2 switches to 1 producing, by means of the monostable MNS, the signal $GENRES_2$ which produces the signal GENRES and resets the logic unit LOG, so starting up conversion of the input signal $V_2$. According to the description above with reference to FIG. 1, said conversion starts when both RESOSC and GENRES return to value 0. Conversion of the signal $V_2$ is completed when the corresponding digital signal is written on the bus $OUTBUS_2$ and when a signal $W_2$ is produced indicating that conversion has been completed and whose falling edge sets the flip-flop dff2. In this way, CONV2 switches to 0 and RESOSC to 1, which puts the conversion circuit 1 in a state of power-down, where the circuit 1 awaits a successive conversion request. With reference to the waveforms illustrated in FIG. 5, it is presumed in the embodiment that said request is a request associated to the signal $R_2$, which again switches to logic level 1 and makes it possible to produce a signal CONV2R negated equal to 0 and a signal CONV2 equal to 1. In its turn, CONV2, by producing GENRES2 and GENRES, starts up a new conversion of the signal $V_2$. With further reference to FIG. 5, in this embodiment it is contemplated that before completion of the non-priority conversion of the signal $V_2$, a new request to convert the signal $V_1$ arrives as a result of the request signal $R_1$ switching back to logic level 1.

Following said transition of the request signal $R_1$, the monostable $MNS_1$ produces an output signal $GENRES_1$, with a single pulse, which produces the signal GENRES that interrupts the conversion underway. The signal $GENRES_1$ also resets the logic unit LOG, so starting up conversion of the input signal $V_1$. According to the above description with reference to FIG. 1, said conversion starts when both RESOSC and GENRES have a value 0.

The signal $GENRES_1$ also resets the delay-flip-flop dff1 forcing the output CONV1 to switch to 1 which will maintain said logic value for the entire duration of conversion. By means of the gate Nor_1, starting from the signal CONV1, a signal CONV2 is produced which remains at low logic level for the entire duration of conversion of the signal $V_1$ independently of the logic value of the signal CONV2R negated correlated to the request signal $R_2$. In this case however, the conversion request associated to the signal $R_2$ remains stored by means of the signal CONV2R negated, therefore said request is put on hold even if conversion of the signal $V_2$ already underway has been interrupted by the request signal $R_1$. After completion of conversion of signal $V_1$ a new falling edge of the conversion completion signal $W_1$ switches the signal CONV1 back to 0, making it possible to carry out, by means of the signal $GENRES_2$, the non-priority conversion of the signal $V_2$ previously aborted.

Figure 6:
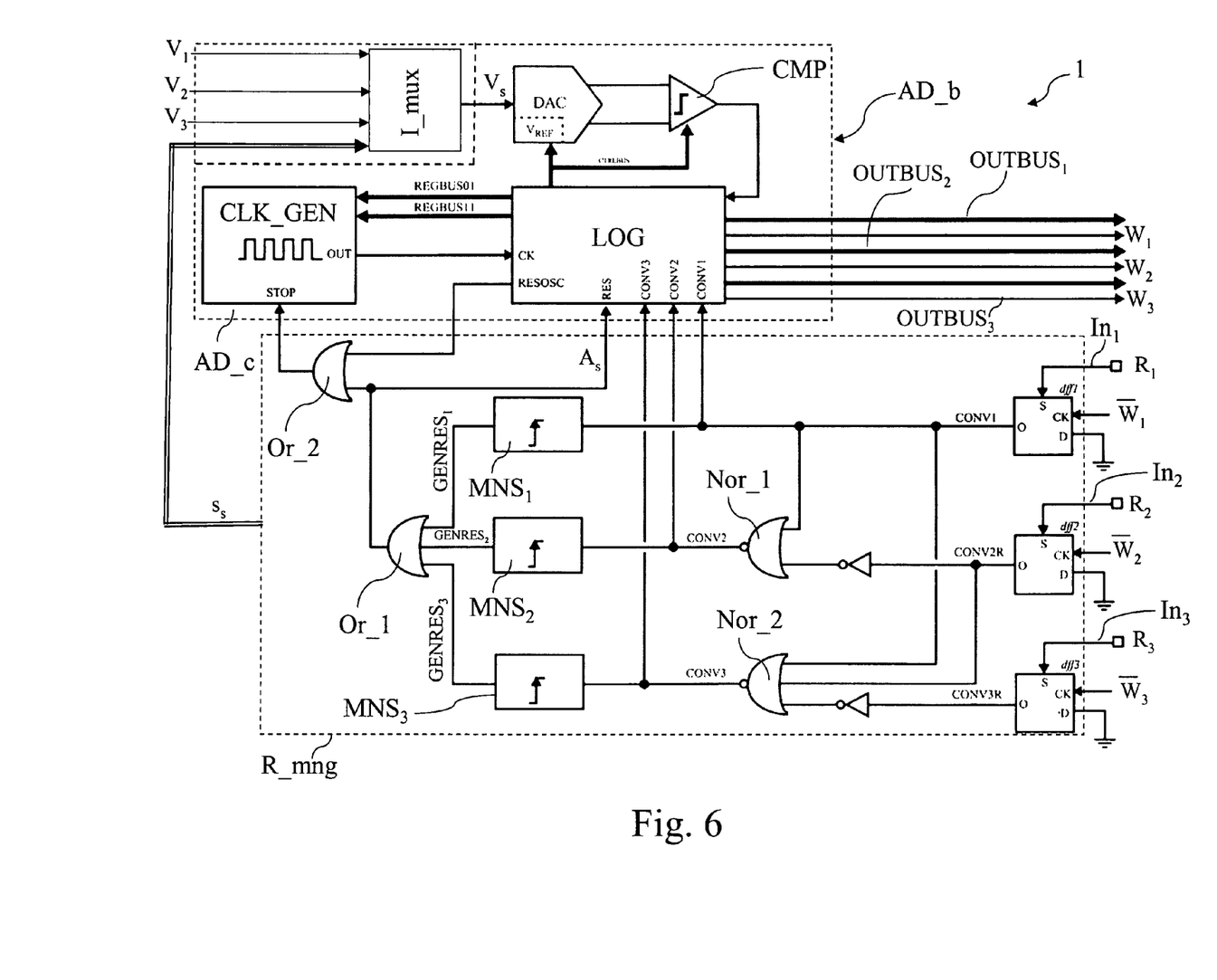
FIG. 6 shows a second embodiment of a conversion circuit according to the invention.

FIG. 6 shows a block diagram of a second embodiment of a conversion circuit 1 according to the present invention. In the embodiment in FIG. 6, the circuit 1 is provided to selectively convert a first input signal $V_1$, a second input signal $V_2$ and a third input signal $V_3$ into a corresponding digital code.

The management block R_mng is implemented by means of a network of logic gates Or_1, Or_2, Nor_1, Nor_2, of delaying elements dff1, dff2, dff3 and of monostable circuits $MNS_1$, $MNS_2$, $MNS_3$ and comprises a first $In_1$, a second $In_2$ and a third input $In_3$ to receive a first $R_1$, a second $R_2$ and a third $R_3$ conversion request signal respectively, sent to the conversion circuit 1 from a first, a second and a third request unit respectively, not illustrated in the figure.

On the basis of the detailed description above with reference to the circuit in FIG. 4, the skilled in the art can deduce that the management block R_mng in FIG. 6 is provided to assign three distinct priority levels to the conversion request signals received in input, so that the request signal $R_1$ is assigned the highest priority level, the request signal $R_3$ is assigned the lowest priority level and the request signal $R_2$ is assigned an intermediate priority level.

The functioning of the circuit in FIG. 6 can be easily deduced by the skilled in the art on the basis of the above description of the conversion circuit in FIG. 4. However, a first difference regards the fact that in the circuit in FIG. 6, the signals CONV1, CONV2, CONV3 are sent to the logic unit LOG so that it can identify the requesting unit. A second difference lies in the fact that the conversion start-up signal $A_s$ sent to the logic unit LOG is produced from an OR (logic gate OR Or_1) of the three signals $GENRES_1$, $GENRES_2$ and $GENRES_3$. Therefore, only one start-up and reset input RES to receive said conversion start-up signal $A_s$ is provided for in the logic unit LOG of the converter AD_c. In the embodiment in FIG. 6, the selection signal $S_s$ can be produced indifferently in output from the management block R_mng either from the signals $GENRES_1$, $GENRES_2$ and $GENRES_3$ or preferably from the signals CONV1, CONV2 and CONV3. In the latter case, preferably said selection signal $S_s$ is produced in output from the same logic unit LOG, given that said unit, as illustrated in FIG. 6, already reads and interprets the signals CONV1, CONV2 and CONV3 to keep trace of the fact that one given conversion underway was started up by a particular requesting unit. For example, in the diagram in FIG. 6, if CONV1=0, CONV2=1 and CONV3=0, the signal to start up conversion will be the request signal $R_2$ and the selection signal $S_s$ will be such that the multiplexer I_Mux outputs a signal $V_s=V_2$. With reference again to FIG. 6, if CONV1=1, CONV2=0 and CONV3=0, the request signal to start up conversion will be the request signal $R_1$ and the selection signal $S_s$ will be such that the multiplexer I_Mux outputs a signal $V_s=V_1$.

In brief, the circuit in FIG. 6 functions in such a way that when a request signal with the maximum priority level arrives, said circuit immediately starts up conversion of the corresponding analog input signal, blocking the possibility of starting up new conversions or aborting conversions started up by request signals with a lower priority level. Furthermore, a conversion request with an intermediate priority level can inhibit conversion already started by a request signal with a lower priority level. The advantage of the conversion circuit in FIG. 6 compared to that in FIG. 4 is that the former has a modular structure which can easily be generalized in the case where the requesting units are n instead of three, as in the particular embodiment illustrated.

Figure 7:
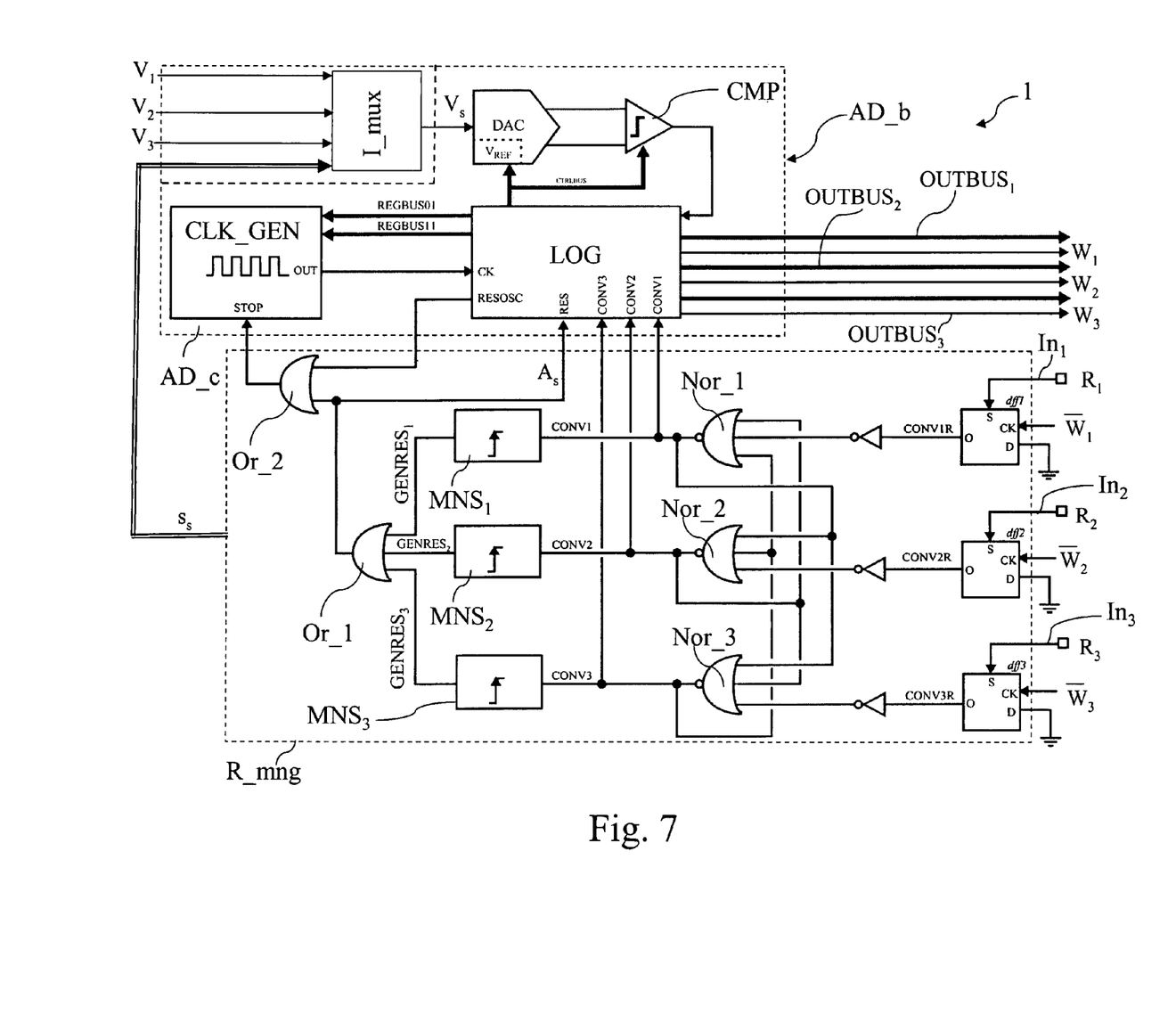
FIG. 7 shows a third embodiment of a conversion circuit according to the present invention.

FIG. 7 shows a further embodiment of a conversion circuit according to the present invention. Said circuit, very similar to the circuit in FIG. 6, can process requests from three distinct requesting units. The only difference is that the management block R_mng is provided to assign identical priority levels to the three request signals $R_1$, $R_2$, $R_3$. In practice, said circuit does not abort any conversions already underway, but each new request is queued while waiting to be processed.

The structure in FIG. 7 is also modular and can be generalized in the case where there are n possible request signals in input to the management block R_mng coming from n respective distinct requesting units.

It should also be noticed that, on the basis of the description referring to FIGS. 6 and 7, it is also possible to design a management block R_mng which assigns different priority levels to the input request signals and which can also assign the same priority level to some of said request signals.

From the above description, it can be understood how a conversion circuit according to the present invention can reach the predetermined objects, solving the problems of space occupied and energy consumed mentioned above with reference to the solutions used in the prior art.

It should be noted that, even though only descriptions are given of embodiments of the present invention wherein conversion completion signals are sent both to the management circuit R_mng and to the requesting units, in an alternative embodiment, wherein an output bus for each requesting unit is provided, it is possible to avoid sending the conversion completion signals to the requesting units, on condition that a timing system is provided whereby the requesting units are provided to access the assigned output bus after a minimum predetermined period of time starting from the moment when the request is sent from said requesting units.

It should also be noted that the above-described embodiments of logical networks for the implementation of the management block R_mng are merely illustrative and non-limiting and that other implementation embodiments can easily be designed by a person skilled in the art.

Naturally, in order to satisfy contingent and specific requirements, a person skilled in the art may apply to the above-described conversion circuit according to the invention many modifications and variations, all of which, however, are included within the scope of protection of the invention as defined by the following claims.

The invention claimed is:

1. A circuit for selectively converting analog signals into corresponding digital codes, comprising:
   a management block comprising a plurality of inputs, each of the inputs receiving a request signal carrying a request to convert an analog signal into a digital code, wherein the management block includes means for assigning to said request signals a corresponding priority level on the basis of from which of the plurality of inputs said request signals are received and further wherein the management block selects one of said request signals on the basis of said assigned priority level and outputs a conversion start-up signal corresponding to the selected request signal; and
   a conversion block receiving as input the analog signals and said conversion start-up signal, wherein the conversion block responds to the input analog signals and the conversion start-up signal to start up conversion of said input analog signals beginning with one of the received input analog signals corresponding with the selected request signal,
   wherein said priority level assignment means includes a network of coupled logic gates, monostable circuits, and delaying elements, with said network operative to perform hardware assignment of said priority levels dependent upon the inputs on which the request signals are received.

2. The circuit of claim 1, wherein said conversion block further includes an output connected to a further input of said management block for sending to said management block a conversion completion signal indicating completion of said started-up conversion for at least the one of the received input analog signals corresponding to the selected request signal.

3. The circuit of claim 2, wherein said conversion block sends said conversion completion signal to a requesting unit which sent said selected request signal to said conversion circuit.

4. The circuit of claim 1, wherein the plurality of analog signals each correspond to a respective one of the request signals, the conversion block including:
   an analog/digital converter having an input for selectively receiving one of the analog signals of said plurality;
   selection means including a plurality of inputs for receiving said plurality of analog signals to be converted, said selection means also being provided for receiving from said management block a selection signal for selecting an analog signal corresponding to the selected request signal, said selection means further including an output connected to said input of the converter for sending to said converter said selected analog signal corresponding to said selected request signal.

5. A circuit for selectively converting analog signals into corresponding digital codes, comprising:
- a management block comprising a plurality of inputs, each of the inputs receiving a request signal carrying a request to convert an analog signal into a digital code, wherein the management block includes means for assigning to said request signals a corresponding priority level on the basis of from which of the plurality of inputs said request signals are received and further wherein the management block selects one of said request signals on the basis of said assigned priority level and outputs a conversion start-up signal corresponding to the selected request signal; and
- a conversion block receiving as input the analog signals and said conversion start-up signal, wherein the conversion block responds to the input analog signals and the conversion start-up signal to start up conversion of said input analog signals beginning with one of the received input analog signals corresponding with the selected request signal, said conversion block including:
  - quantization means having inputs to receive said plurality of analog signals;
  - a register having an output to provide said digital code;
  - clock pulse generator comprising an oscillator provided to be started/stopped by a binary signal applied to its activation input and obtained from a combination of said request signals; and
  - logic means, connected to the quantization means, to the register and to the clock pulse generator, provided to reply to said conversion start-up signal in order to activate the quantization means so that they carry out predetermined operations timed by the clock pulses and feed said digital code in output into said register.

6. The circuit of claim 5, wherein said logic means is operative to generate a stop signal of the oscillator and wherein said binary signal to be applied to the activation input of the oscillator is obtained from the stop signal.

7. The circuit of claim 6, wherein said logic means comprises a counter to manage the predetermined timed operations with a reset input provided to receive said conversion start-up signal.

8. An analog to digital conversion assembly, comprising:
- a conversion block comprising an analog to digital converter configured for selectively converting a plurality of received analog signals into digital signals;
- a management block receiving a plurality of conversion requests corresponding to the plurality of received analog signals and assigning a priority to each of the received conversion requests,
- wherein the management block transmits a conversion start signal to the conversion block for a select one of the received conversion requests based on the priorities, includes a network of coupled logic gates, monostable circuits, and delaying elements, and assigns the priorities to the received conversion requests based on which of a plurality of inputs to the management block was used to receive each of the conversion requests.

9. The assembly of claim 8, wherein the conversion block further comprises a selector for selecting one of the plurality of received analog signals corresponding to the select one of the received conversion requests.

10. The assembly of claim 9, wherein the selector sends the selected one of the plurality of received analog signals to the analog to digital converter which operates to output a digital signal based on the selected one of the analog signals.

11. The assembly of claim 10, wherein the analog to digital converter comprises a successive approximation register (SAR) analog/digital converter.

12. The assembly of claim 8, wherein the conversion block further operates to transmit signals indicating completion of conversion from analog to digital for each of the plurality of analog signals.

13. The assembly of claim 12, wherein the management block responds to receiving the completion of conversion signals by transmitting a next conversion start signal to the conversion block for a next highest priority one of the received conversion requests.

14. A circuit for selectively converting analog signals into corresponding digital codes, comprising:
- a management block comprising a plurality of inputs, each of the inputs receiving a request signal carrying a request to convert an analog signal into a digital code, wherein the management block includes means for assigning to said request signals a corresponding priority level on the basis of from which of the plurality of inputs said request signals are received and further wherein the management block selects one of said request signals on the basis of said assigned priority level and outputs a conversion start-up signal corresponding to the selected request signal; and
- a conversion block receiving as input the analog signals and said conversion start-up signal, wherein the conversion block responds to the input analog signals and the conversion start-up signal to start up conversion of said input analog signals beginning with one of the received input analog signals corresponding with the selected request signal,
wherein said management block is operative to:
- keep on hold a first received conversion request signal with an assigned first priority level until completion of a conversion started up by a second concurrent request signal with an assigned second priority level if said second level is greater than or equal to the first level; and
- if not greater than or equal to the first level, interrupt said conversion started up by the second signal, putting on hold said second concurrent request signal if said second level is lower than the first level.

15. The circuit of claim 14, wherein said conversion block includes:
- quantization means having inputs to receive said plurality of analog signals;
- a register having an output to provide said digital code;
- clock pulse generator comprising an oscillator provided to be started/stopped by a binary signal applied to its activation input and obtained from a combination of said request signals;
- logic means, connected to the quantization means, to the register and to the clock pulse generator, provided to reply to said conversion start-up signal in order to activate the quantization means so that they carry out predetermined operations timed by the clock pulses and feed said digital code in output into said register.

16. The circuit of claim 15, wherein said logic means is operative to generate a stop signal of the oscillator and wherein said binary signal to be applied to the activation input of the oscillator is obtained from the stop signal.

17. The circuit of claim 15, wherein said logic means comprises a counter to manage the predetermined timed operations with a reset input provided to receive said conversion start-up signal.

* * * * *